United States Patent [19]

Consiglio et al.

[11] Patent Number: 5,525,832
[45] Date of Patent: Jun. 11, 1996

[54] SUBSTRATE INSULATION DEVICE

[75] Inventors: Pietro Consiglio; Pietro Erratico, both of Milan, Italy

[73] Assignee: SGS-Thomson Microelectronics S.r.l., Agrate Brianza, Italy

[21] Appl. No.: 17,816

[22] Filed: Feb. 16, 1993

[30] Foreign Application Priority Data

Feb. 17, 1992 [IT] Italy .................................. MI92A0338

[51] Int. Cl.$^6$ ............................ H01L 29/10; H01L 27/02
[52] U.S. Cl. .......................... 257/544; 257/547; 257/335; 257/378; 257/601
[58] Field of Search ..................................... 257/544, 546, 257/547, 551, 552, 335, 337, 378, 566, 577, 601, 603

[56] References Cited

U.S. PATENT DOCUMENTS 5,256,893  10/1993  Yasuoka .................................. 257/335

OTHER PUBLICATIONS

IBM Technical Disclosure Bulletin vol. 29, No. 2, Jul. 1986, New York US–pp. 567–569, "Reverse Bias Over–Current . . .".

Primary Examiner—Mark V. Prenty
Attorney, Agent, or Firm—Wolf, Greenfield & Sacks

[57] ABSTRACT

A substrate insulation device includes power supply terminals which are connected to a terminal of an active integrated element which has, with respect to a substrate on which it is defined, at least one reverse-biased junction.

14 Claims, 4 Drawing Sheets

5,525,832

SUBSTRATE INSULATION DEVICE

BACKGROUND OF THE INVENTION

1. Field of the Invention

The present invention relates to a substrate insulation device.

2. Discussion of the Related Art

As is known, in integrated electronic circuits, technically known as chips, there is a portion, known as the substrate, on which active and passive elements with possibly mutually different characteristics are produced. The elements are separated by partitions made of a material which is similar to the electrically and physically connected insulating substrate. The substrate of every integrated circuit is placed at the negative voltage which has the highest absolute value. In this manner, the partitions act as insulators among the various active and passive elements of the integrated circuit, allowing operation of the various elements.

There are applications, as described hereinafter, in which, due to applicable statutory provisions or to other kinds of problems, negative electric voltages whose modulus is greater than the negative voltage of the substrate are applied to the integrated circuits.

This fact entails, for example, that the currents involved must be extremely small, similar in value to the so-called leakage current, even if the active elements are at a lower voltage than the substrate.

In order to solve this problem, it is possible to use high-voltage capacitors as well as devices, for main applications, which use a single chip or dual integrated circuits on which most, if not all, of the active components which compose the discrete printed circuit are integrated, thus combining all the functions on a single substrate.

The aim of the present invention is to eliminate or substantially reduce the problems described above by providing a substrate insulation device which solves the problem of the presence of negative voltages whose modulus is greater than the reference voltage of the substrate of the integrated circuit.

Within the scope of the above aim, an object of the present invention is to provide a device which can maintain the functions required by a particular application even if voltages lower than the substrate reference voltage are applied.

Another object of the present invention is to provide a device which is highly reliable, relatively easy to manufacture and at competitive costs.

SUMMARY OF THE INVENTION

This aim, the objects mentioned and others which will become apparent hereinafter are achieved by a substrate insulation device according to the invention, which includes a power supply, an integrated circuit substrate, and an active integrated element defined on the substrate. The active integrated element is connected to the power supply and includes at least one reverse-biased junction with respect to the substrate.

In a preferred embodiment of the present invention the active integrated element further includes a DMOS transistor and first and second parasitic diodes.

BRIEF DESCRIPTION OF THE DRAWINGS

Further characteristics and advantages of the invention will become apparent from the description of a preferred but not exclusive embodiment of a substrate insulation device according to the invention, illustrated only by way of a non-limiting example in the accompanying drawings, wherein.

DETAILED DESCRIPTION

Figure 1:
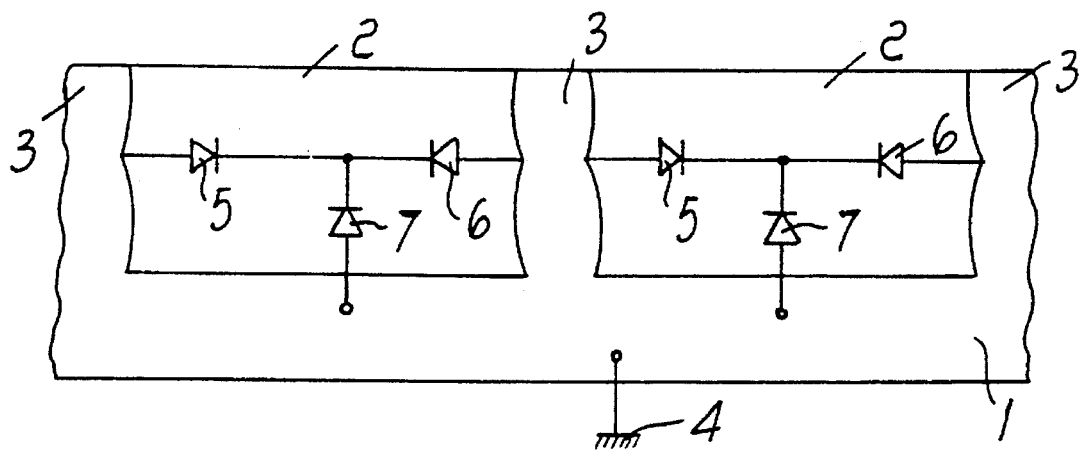
FIG. 1 is a sectional front elevation view of the junctions between the various wells of an integrated electronic component.

With reference to FIG. 1, which shows a conventional integrated circuit, a substrate 1 accommodates active elements 2 which are mutually insulated by means of partitions 3 made of a material which is similar to the substrate and are usually doped with impurities whose polarity is opposite to that of the impurities with which the active elements 2 are doped. The substrate 1 is connected to a ground 4 or to the negative voltage of a higher modulus located in an integrated circuit of any type, which is not shown. Junctions, schematically indicated in FIG. 1 by the parasitic diodes 5, 6 and 7, are formed between the partitions 3 and the active portions 2 and between the substrate 1 and the active portions 2.

When the substrate 1 is biased at the lower negative voltage with respect to the voltages of the electronic circuit, the partitions 3 act as perfect insulators between the various active areas 2, with the diodes 5, 6 and 7 reverse-biased. Conversely, if negative voltages whose modulus is higher than the substrate biasing voltage are applied to the active areas 2, the diodes 5, 6 and 7 start to conduct with respect to their standard reverse-biasing condition, in which they must be in order to ensure mutual insulation among the active areas 2.

Applications which typically have this problem are those shown in FIGS. 2 to 6, i.e. conventional telephone applications in which the polarity of the telephone line is not preset.

In this example, as well as in others which are not mentioned in detail herein, when a negative voltage whose modulus is higher than the biasing voltage of the substrate 1 is applied to the active components 2, with consequent conduction of the diodes 5, 6 and 7, there results loss of mutual insulation.

Figure 2:
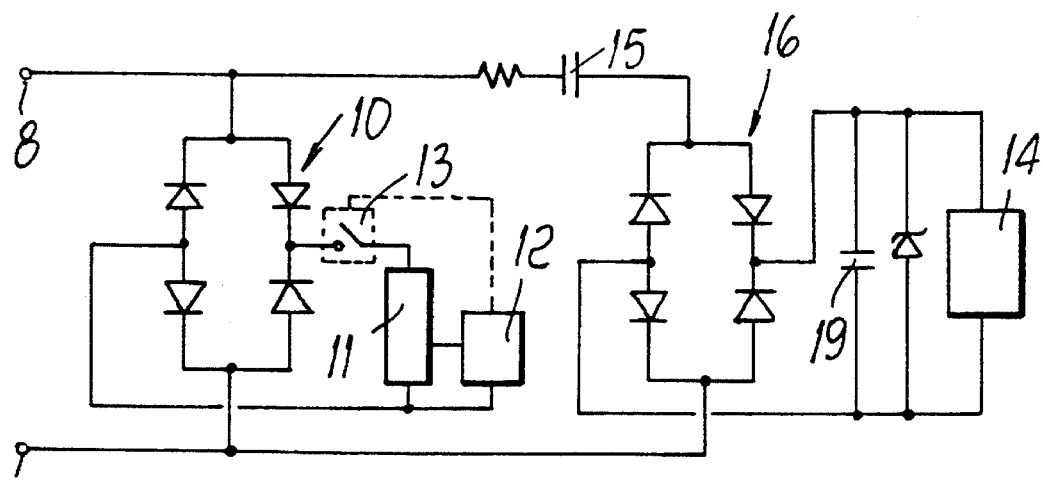
FIG. 2 is a known example of an application which uses integrated components shown in FIG. 1.

In FIG. 2, which illustrates a conventional telephone circuit, the telephone line, having terminals 8 and 9, is DC-biased by an exchange battery. The polarity is not set, and it is thus necessary to have, in the telephone set, a biasing bridge 10 for the talk circuit 11 and for the signalling circuit 12.

The circuits 11 and 12, which are activated when the handset is unhooked by the closure of the switch 13, are produced in an integrated manner, and each one has its own substrate.

The ringer circuit 14 must be DC-decoupled, i.e. no direct current must flow along the telephone line in the on-hook or ringing conditions, and a high-voltage capacitor 15 is used for this purpose. A full-wave rectifier 16 is used for the ringer and a discrete capacitor or filter. 19 is connected in parallel with the integrated circuit 14 between the circuit 14 and rectifier 16 which supplies the integrated circuit 14 with the respective substrate.

Figure 3:
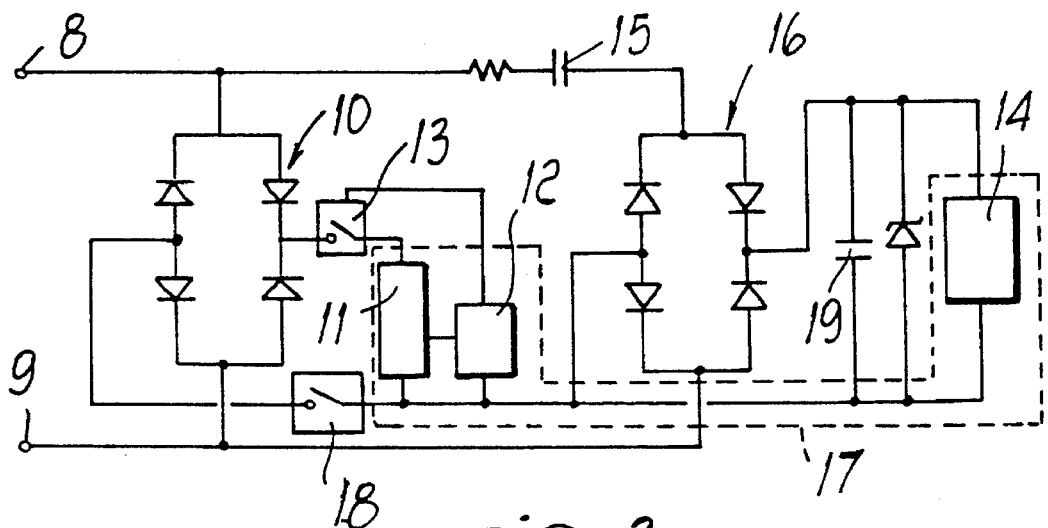
FIG. 3 is another known example of an application which uses components shown in FIG. 1, executed in compact form.

With the onset of monochip electronic circuits, circuits which combine on a single common substrate, the functions provided by three different circuits, i.e. signalling 12, talking 11 and ringing 14, the substrate becomes a common substrate. For example, as shown in FIG. 3, wherein the monochip is designated by the reference numeral 17, it is indispensable to have a further switch 18 which separates the common substrate of the monochip 17 from the negative terminal of the biasing bridge 10.

Figure 4:
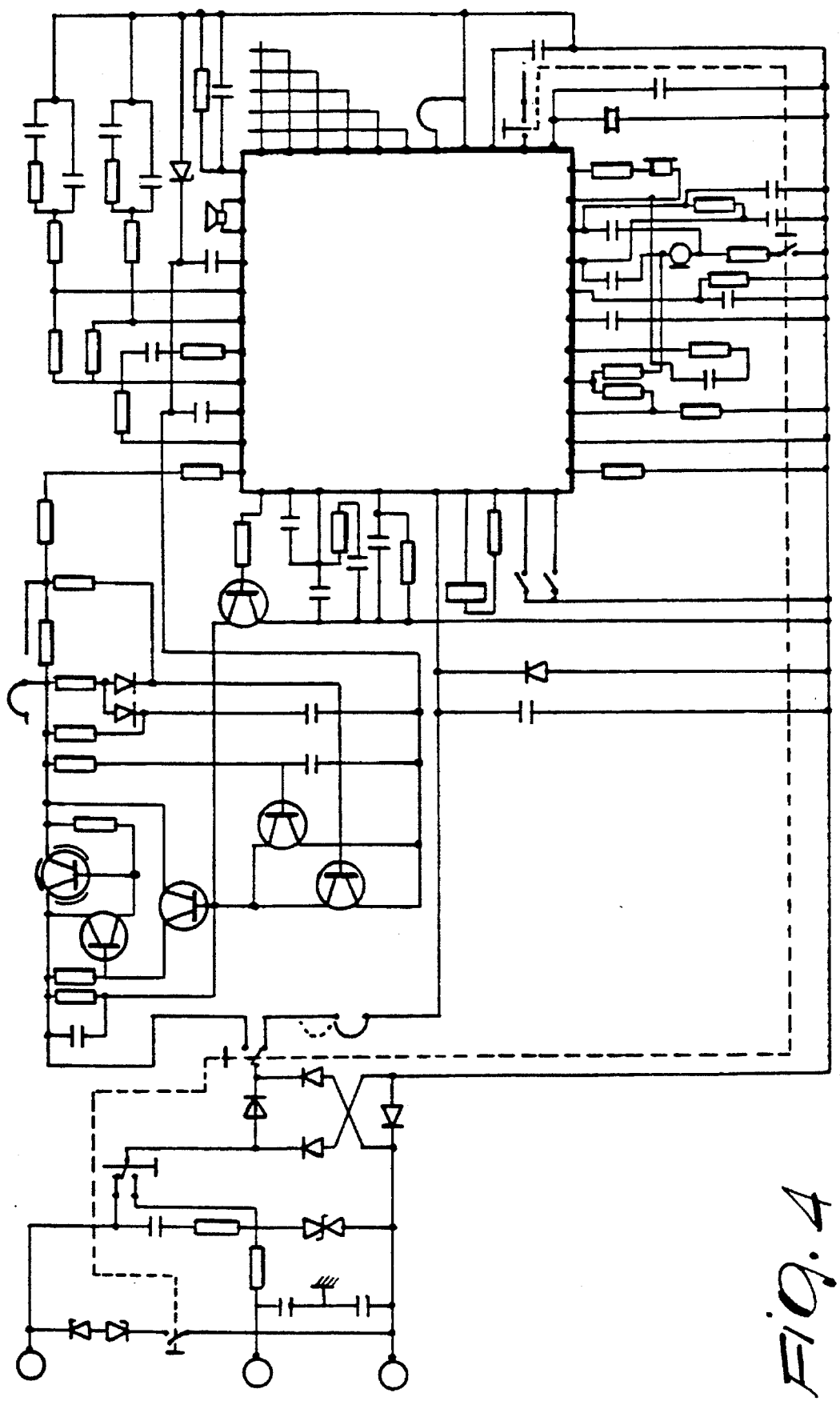
FIG. 4 is an electric diagram of a known telephone set.
Figure 5:
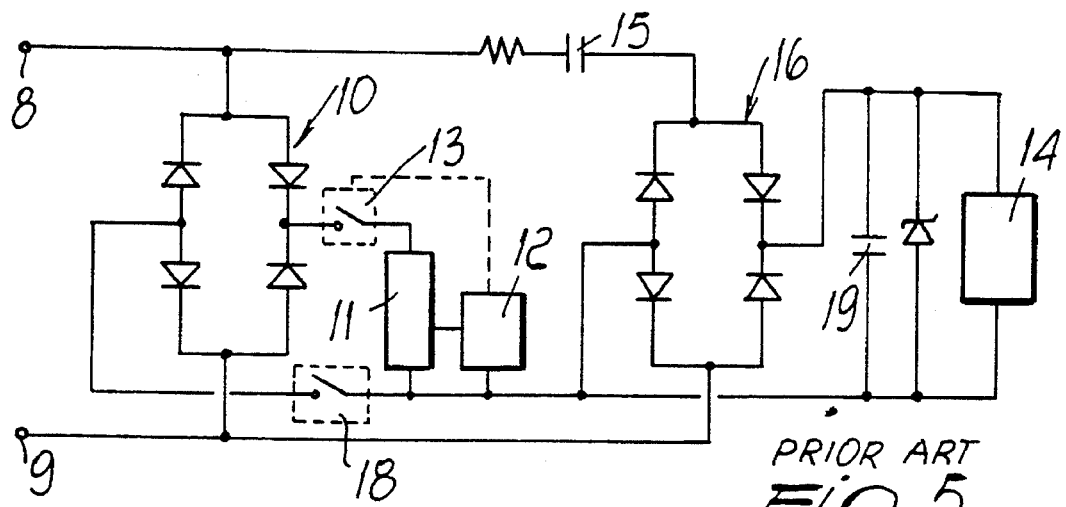
FIG. 5 is an electric diagram of a further known example of an application which uses the components shown in FIG. 1.
Figure 6:
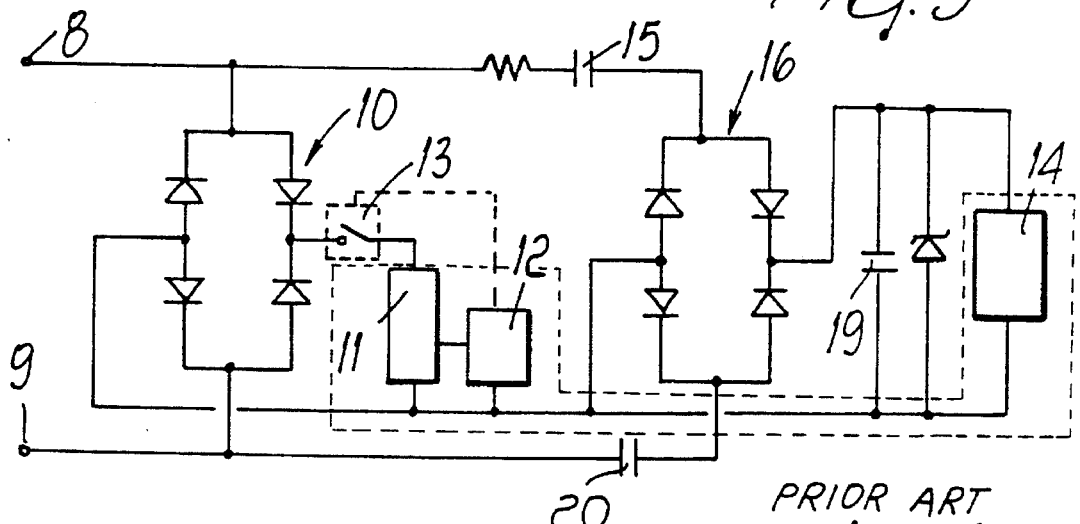
FIG. 6 is another electric diagram of a known application which uses the component shown in FIG. 1.

Furthermore, in order to comply with both national and international applicable statutory provisions, it is necessary to use layouts which include either mechanical switches, as shown in FIG. 4, discrete switches, as shown in FIG. 5, or a second high-voltage decoupling capacitor 20, as shown in FIG. 6, all of which are actuatable electronic components.

In order to eliminate the capacitor 20 without using a further (external switch, it is desirable to use an) integratable switch capable of handling voltages which are negative with respect to the common substrate, i.e. with respect to the conventional ground of the circuit. It is thus essential to know in detail all of the paths through which the voltages and currents are distributed within an integrated component.

The insulation device according to the present invention includes power supplies which are connected to a terminal of an active integrated element which has, with respect to a substrate on which it is defined, at least one reverse-biased junction.

Figure 7A:
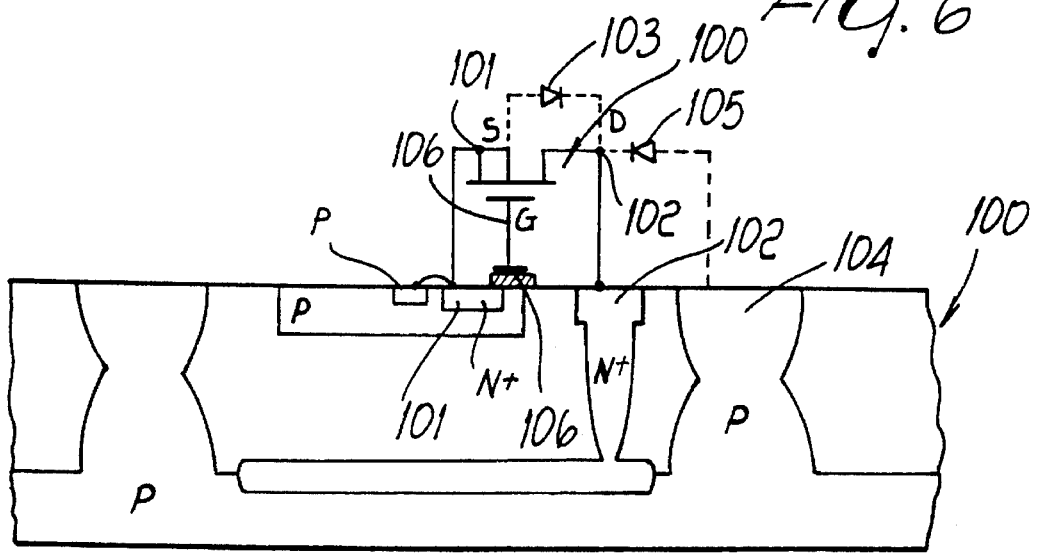
FIG. 7a is a sectional front elevation view of a DMOS transistor, illustrating the terminals and relative junctions according to the present invention.
Figure 7B:
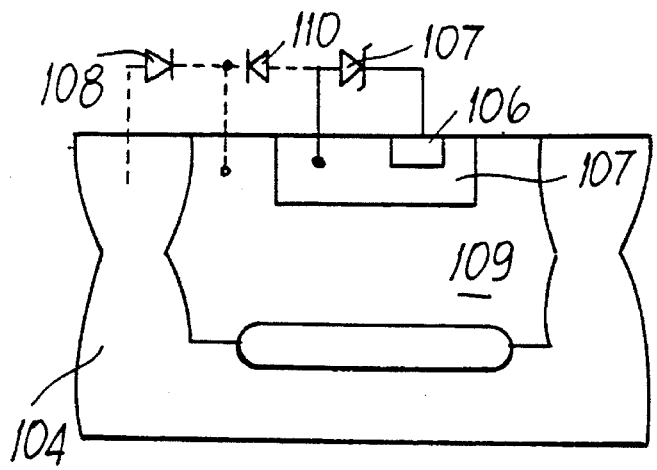
FIG. 7b is a sectional front elevation view of a Zener diode, illustrating the terminals and junctions according to the present invention.

In FIGS. 7a and 7b, the circuits arranged above the substrate shown schematically represent the connections between the active integrated component and the substrate which encloses them.

The active integrated element Comprises a DMOS transistor, generally designated by the reference numeral 100, which has its source terminal 101 connected to the body (P-type diffusion) and connected to the drain terminal 102 through a first parasitic diode 103. The drain terminal 102 is connected to a portion 104 of the insulating substrate through a second parasitic diode 105, and the gate terminal 106 is connected to a power supply (not shown).

Parasitic diode 103, which forms the reverse-biased junction, is connected to the drain terminal 102 by means of its cathode terminal and to the source terminal 101 by means of its anode terminal; the source terminal is connected to the body (P-type diffusion) of the DMOS transistor 100.

A protection Zener diode 107 is integrated, as shown in FIG. 7b, in parallel to the gate terminal 106 and is connected to the substrate 104 by means of a third parasitic diode 108 and to an active area 109 by means of a fourth parasitic diode 110. The Zener diode 107 protects the gate terminal 106 by virtue of its own breakdown voltage, which must be lower than the maximum gate-source breakdown voltage.

Figure 8A:
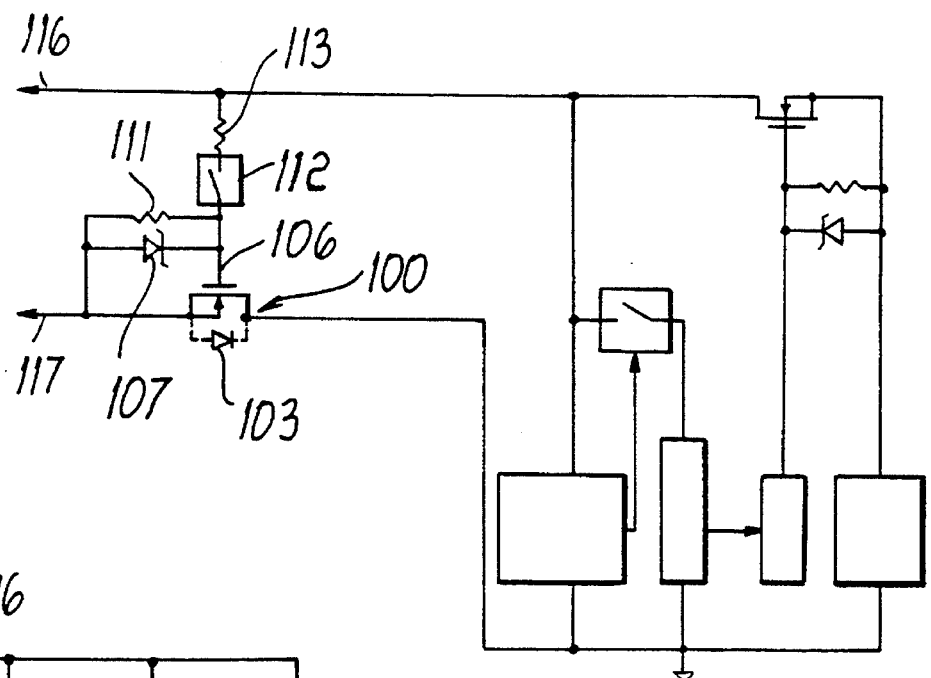
FIG. 8a is a conceptual diagram of an embodiment of the present invention.
Figure 8B:
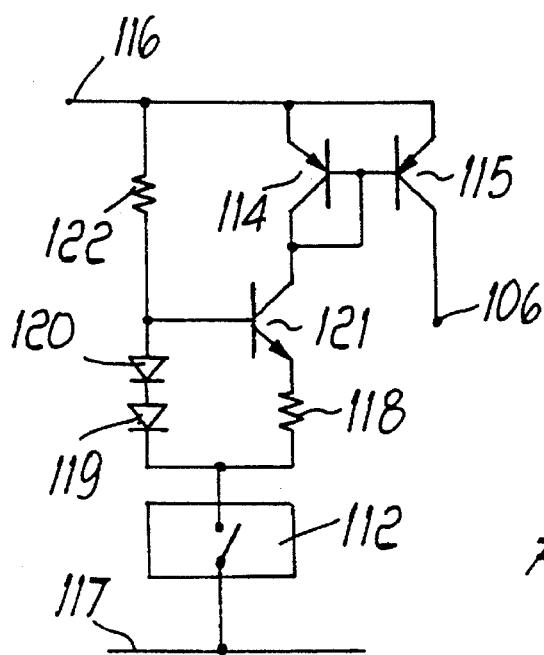
FIG. 8b is a schematic view of the circuit details of the present invention.

FIG. 8a shows schematically the transistor and substrate 100, integral circuitry therewith, and connections to a power supply.

In order to ensure maintaining the off state of the DMOS transistor 100 when the switch-on command is not present, as shown in FIG. 8a, it is convenient to insert, in parallel to the Zener diode 107, an integrated resistor 111 which can be defined on the substrate 104 with highly resistive polysilicon having a resistance of 2 kohm/square mm or with a diffused resistor, technically known as a "drain extension" with a resistance of 20 kohm/square mm, using particular layout solutions.

The DMOS transistor 100 is switched on by closing a switch 112 which connects a second resistor 113 to the gate terminal 106. This provides a voltage divider between the resistors 111 and 113 which limits the minimum operating voltage of the telephone circuit, while the absorption current is not constant.

Preferably, the gate terminal 106 is driven by a power supply, such as a current source which includes a first diode-connected bipolar transistor 114 and a second bipolar transistor 115. The first bipolar transistor 114 has its emitter terminal connected to a power supply terminal 116, and its base and collector terminals are connected together and to the base terminal of the second transistor 115. The second bipolar transistor 115 has its emitter terminal connected to the terminal 116 of the power supply and its collector terminal connected to the gate terminal 106 of the DMOS transistor 100.

The current source also includes switch 112, which is connected to another terminal 117 of the power supply; a third resistor 118 and the cathode terminal of a first diode 119 are connected to the output terminal of the current source. A second diode 120 is arranged in series with the first diode 119, and its anode terminal is connected to a fourth resistor 122, which is connected to the terminal 116 of the power supply, and to the base terminal of a third bipolar transistor 121.

The third transistor 121 has its emitter terminal connected to the third resistor 118 and its collector terminal connected to the collector and base terminals of the first bipolar transistor 114 and to the base terminal of the second bipolar transistor 115. The current source can also be realized with equivalent MOSFET transistors as will be appreciated by those skilled in the art.

If the above described current source is integrated, it interfaces with the gate terminal 106 through a P-type doped layer in order to eliminate any parasitic paths towards the substrate if there is a voltage which is negative with respect to the bias of the substrate. Advantageously, in the case of low voltages on the telephone line power supply terminals 116 and 117, the voltage across the current source which interfaces with the gate terminal 106 can be practically nil, with an improvement in the minimum operating voltage.

Practical tests have shown that the present invention achieves the intended aim and objects, advantageously providing the complete integration of functions, and consequently of components, which, in the past, was provided by both electronic and mechanical discrete components.

Conveniently, the device according to the invention allows integration of components providing all the functions in a single chip, i.e. on a single common substrate, with a further reduction in discrete components.

Such integration allows a reduction in manufacturing costs in two separate ways: first, by simplifying the telephone sets' circuitry, and thus simplifying the operations for assembly and production of the printed circuit, analysis of the circuit and of the finished set; and second, in the management area, i.e. reducing storage, thereby simplifying administrative control, and the like.

In addition, the reduction in components with the adoption of the monochip reduces constructive complexity, i.e. decreases weldings, couplings and the like.

The invention thus conceived is susceptible to numerous modifications and variations, all of which are within the scope of the inventive concept. All the details may furthermore be replaced with other technically equivalent elements.

In practice, the materials employed, as well as the dimensions, may be any according to the requirements for the particular application.

Having thus described one particular embodiment of the invention, various alterations, modifications, and improvements will readily occur to those skilled in the art. Such alterations, modifications, and improvements as are made obvious by this disclosure are intended to be part of this disclosure though not expressly stated herein, and are intended to be within the spirit and scope of the invention. Accordingly, the foregoing description is by way of example only and is not intended as limiting. The invention is limited only as defined in the following claims and the equivalents thereto.

What is claimed is:

1. A current source comprising:

first and second power supply terminals;

an output terminal;

first, second and third bipolar transistors, each transistor having an emitter, collector and base terminal;

at least one diode; and a switch;

wherein the emitter terminal of the first transistor is connected to the first power supply terminal, the base and collector terminals of the first transistor are connected together, to the base terminal of the second transistor and to the emitter terminal of the third transistor, the emitter terminal of the second transistor is connected to the first power supply terminal, the base terminal of the third transistor is connected through the at least one diode to the switch, the switch is connected to the second power supply terminal, and the collector terminal of the second transistor is connected to the output terminal.

2. A current source as claimed in claim 1 wherein the at least one diode includes two series-connected diodes.

3. A current source as claimed in claim 2 further including first and second resistors, wherein the first resistor is connected to the first power supply terminal and to the base terminal of the third transistor, and the second resistor is connected to the collector of the third transistor and to the switch.

4. A substrate insulation device comprising:

a power supply;

an integrated circuit substrate including an active area; and an active integrated element defined on the substrate and including:

at least one reverse-biased circuit element;

a DMOS transistor having source, drain and gate terminals;

first, second, third and fourth parasitic diodes; and a zener diode;

wherein the source terminal of the DMOS is connected to the drain terminal of the DMOS transistor through the first parasitic diode, the drain terminal of the DMOS transistor is connected to the substrate through the second parasitic diode, the gate terminal of the DMOS transistor is connected to the power supply and in parallel to the zener diode, the zener diode is connected to the substrate through the third parasitic diode, and the zener diode is connected to the active area through the fourth parasitic diode.

5. A device as claimed in claim 4, wherein the at least one reverse-biased circuit element includes the first parasitic diode, the first parasitic diode including an anode terminal and a cathode terminal, the anode terminal of the first parasitic diode being connected to the source terminal of the DMOS transistor, and the cathode terminal of the first parasitic diode being connected to the drain terminal of the DMOS transistor.

6. A device as claimed in any one of claims 4 or 5 wherein the power supply includes first and second power supply terminals and a current source having first and second transistors and at least one diode coupled to the first transistor.

7. A device as claimed in claim 6, wherein the first and second transistors are bipolar transistors, each transistor having an emitter, collector and base terminal, and wherein the emitter terminal of the first transistor is connected to the first power supply terminal, the base and collector terminals of the first transistor are connected together and to the base terminal of the second transistor, the emitter terminal of the second transistor is connected to the first power supply terminal, and the collector terminal of the second transistor is connected to the gate terminal of the DMOS transistor.

8. A substrate insulation device comprising: an integrated circuit substrate including an active area; and an active integrated element defined on the substrate and including:

at least one reverse-biased circuit element;

a DMOS transistor having source, drain and gate terminals;

first, second, third and fourth parasitic diodes; and a zener diode;

wherein the source terminal of the DMOS transistor is connected to the drain terminal of the DMOS transistor through the first parasitic diode, the drain terminal of the DMOS transistor is connected to the substrate through the second parasitic diode, the gate terminal of the DMOS transistor is connected in parallel to the zener diode, the zener diode is connected to the substrate through the third parasitic diode, and the zener diode is connected to the active area through the fourth parasitic diode.

9. A device as claimed in claim 8, wherein the at least one reverse-biased circuit element includes the first parasitic diode, the first parasitic diode including an anode terminal and a cathode terminal, the anode terminal of the first parasitic diode being connected to the source terminal of the DMOS transistor, and the cathode terminal of the first parasitic diode being connected to the drain terminal of the DMOS transistor.

10. A device as claimed in any one of claims 8 or 9 further including a power supply coupled to the active integrated element.

11. A device as claimed in claim 10 wherein the power supply includes first and second power supply terminals and a current source having first and second transistors and at least one diode coupled to the first transistor.

12. A device as claimed in claim 11 wherein the first and second transistors are bipolar transistors, each transistor having an emitter, collector and base terminal, and wherein the emitter terminal of the first transistor is connected to the first power supply terminal, the base and collector terminals of the first transistor are connected together and to the base terminal of the second transistor, the emitter terminal of second transistor is connected to the first power supply terminal, and the collector terminal of the second transistor is connected to the gate terminal of the DMOS transistor.

13. A substrate insulation device comprising:

an integrated circuit substrate;

an active integrated element defined on the substrate and including at least one reverse biased circuit element; and a power supply coupled to the active integrated element, wherein the power supply includes first and second power supply terminals and a current source having first and second transistors and at least one diode coupled to the first transistor.

14. A substrate insulation device comprising:

an integrated circuit substrate including an active area; and an active integrated element defined on the substrate and including:
at least one reverse-biased circuit element;
a transistor having first, second and third terminals;
a plurality of parasitic diodes; and
a zener diode;

wherein the first terminal of the transistor is coupled to the second terminal of the transistor through a first parasitic diode, the second terminal of the transistor is coupled to the substrate through a second parasitic diode, the third terminal of the transistor is connected in parallel to the zener diode, the zener diode is coupled to the substrate through a third parasitic diode, and the zener diode is coupled to the active area through a fourth parasitic diode.

* * * * *

UNITED STATES PATENT AND TRADEMARK OFFICE
CERTIFICATE OF CORRECTION

PATENT NO. : 5,525,832

DATED : June 11, 1996

INVENTOR(S) : Pietro Consiglio and Pietro Erratico

It is certified that error appears in the above-identified patent and that said Letters Patent is hereby corrected as shown below:

Column 5, line 40, replace "emitter" with --collector--; and

Column 5, line 54, replace "collector" with --emitter--.

Signed and Sealed this

Twenty-fourth Day of March, 1998

*Attest:*

BRUCE LEHMAN

*Attesting Officer*          *Commissioner of Patents and Trademarks*